United States Patent
Evans, Jr. et al.

(10) Patent No.: US 9,697,882 B1
(45) Date of Patent: Jul. 4, 2017

(54) ANALOG FERROELECTRIC MEMORY WITH IMPROVED TEMPERATURE RANGE

(71) Applicant: Radiant Technologies, Inc., San Ramon, CA (US)

(72) Inventors: Joseph T. Evans, Jr., Albuquerque, NM (US); Calvin B. Ward, Castro Valley, CA (US)

(73) Assignee: Radiant Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/252,146

(22) Filed: Aug. 30, 2016

(51) Int. Cl.
| | |
|---|---|
| G11C 11/22 | (2006.01) |
| G11C 11/406 | (2006.01) |
| G11C 11/419 | (2006.01) |
| G11C 11/24 | (2006.01) |
| G11C 11/56 | (2006.01) |
| G11C 11/4096 | (2006.01) |
| G11C 11/16 | (2006.01) |

(52) U.S. Cl.
CPC ........ G11C 11/2275 (2013.01); G11C 11/221 (2013.01); G11C 11/2273 (2013.01); *G11C 11/1673* (2013.01); *G11C 11/22* (2013.01); *G11C 11/4096* (2013.01); *G11C 11/419* (2013.01); *G11C 11/5642* (2013.01); *G11C 11/5657* (2013.01)

(58) Field of Classification Search
CPC ... G11C 11/22; G11C 11/221; G11C 11/2275; G11C 11/2273; G11C 11/5657; G11C 11/419; G11C 11/5642; G11C 11/1673
USPC ............... 365/145, 189.011, 189.15, 189.16
See application file for complete search history.

(56) References Cited

U.S. PATENT DOCUMENTS

| | | | | |
|---|---|---|---|---|
| 3,280,332 A | * | 10/1966 | Yando | ............ H03F 11/00 250/214 LS |
| 6,327,558 B1 | * | 12/2001 | Nishimura | ......... G06F 17/5036 703/2 |
| 2004/0062071 A1 | * | 4/2004 | Rodriguez | ............. G11C 11/22 365/145 |

(Continued)

*Primary Examiner* — Ly D Pham
(74) *Attorney, Agent, or Firm* — Calvin B. Ward

(57) ABSTRACT

A ferroelectric memory and a method for operating a ferroelectric memory are disclosed. The ferroelectric memory includes a ferroelectric memory cell having a ferroelectric capacitor characterized by a maximum remanent charge, $Q_{max}$. A write circuit receives a data value having more than two states for storage in the ferroelectric capacitor. The write circuit measures $Q_{max}$ for the ferroelectric capacitor, determines a charge that is a fraction of the measured $Q_{max}$ to be stored in the ferroelectric capacitor, the fraction being determined by the data value. The write circuit causes a charge equal to the fraction times $Q_{max}$ to be stored in the ferroelectric capacitor. A read circuit determines a value stored in the ferroelectric capacitor by measuring a charge stored in the ferroelectric capacitor, measuring $Q_{max}$ for the ferroelectric capacitor, and determining the data value from the measured charge and the measured $Q_{max}$.

19 Claims, 12 Drawing Sheets

(56) References Cited

U.S. PATENT DOCUMENTS

| | | | |
|---|---|---|---|
| 2004/0108531 A1* | 6/2004 | Murayama | H01L 27/11502 257/295 |
| 2008/0003700 A1* | 1/2008 | Wang | H01L 21/2855 438/3 |
| 2012/0134196 A1* | 5/2012 | Evans, Jr. | G11C 11/2273 365/145 |
| 2015/0016175 A1* | 1/2015 | Evans, Jr. | G11C 11/221 365/145 |

* cited by examiner

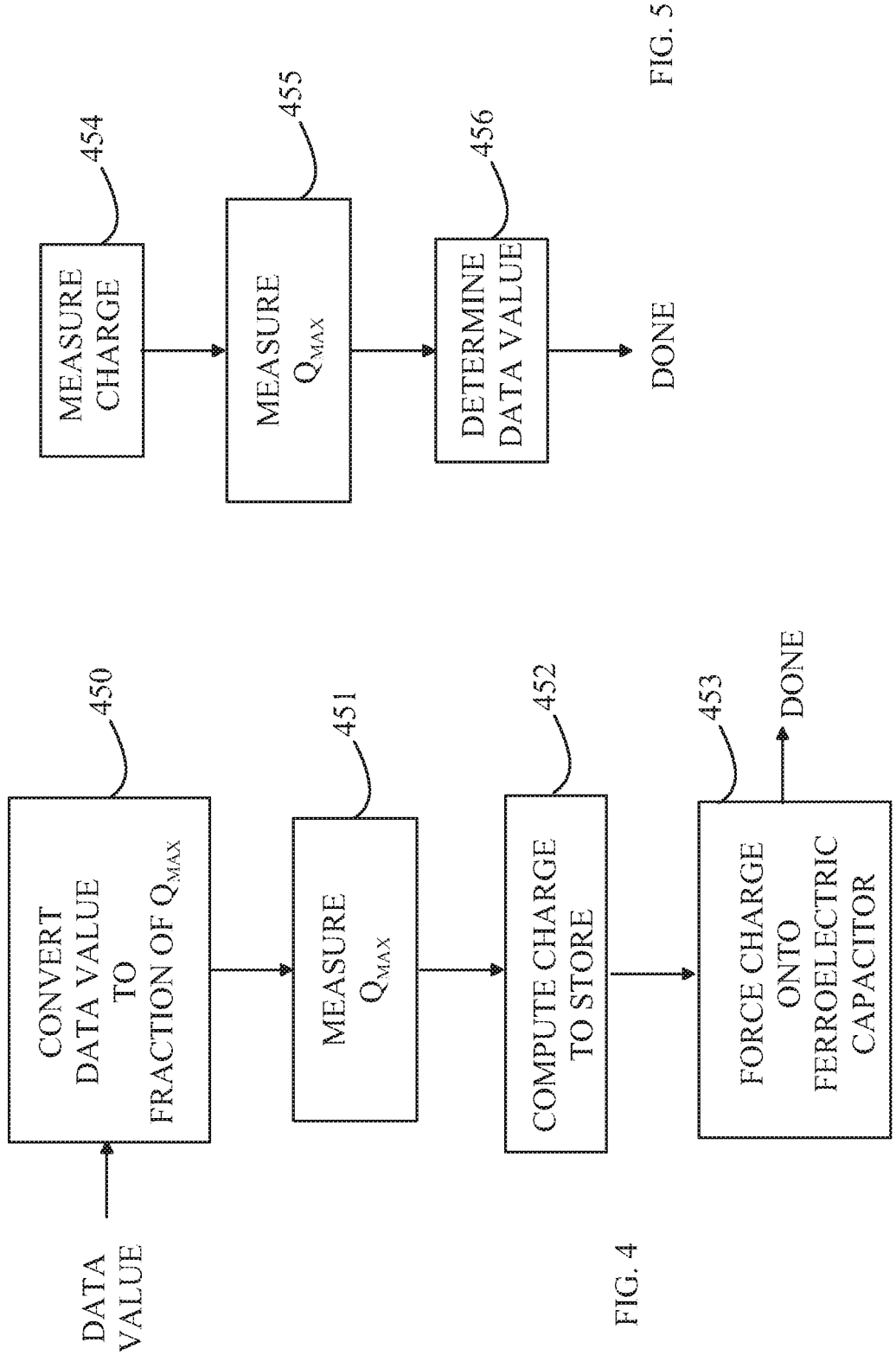

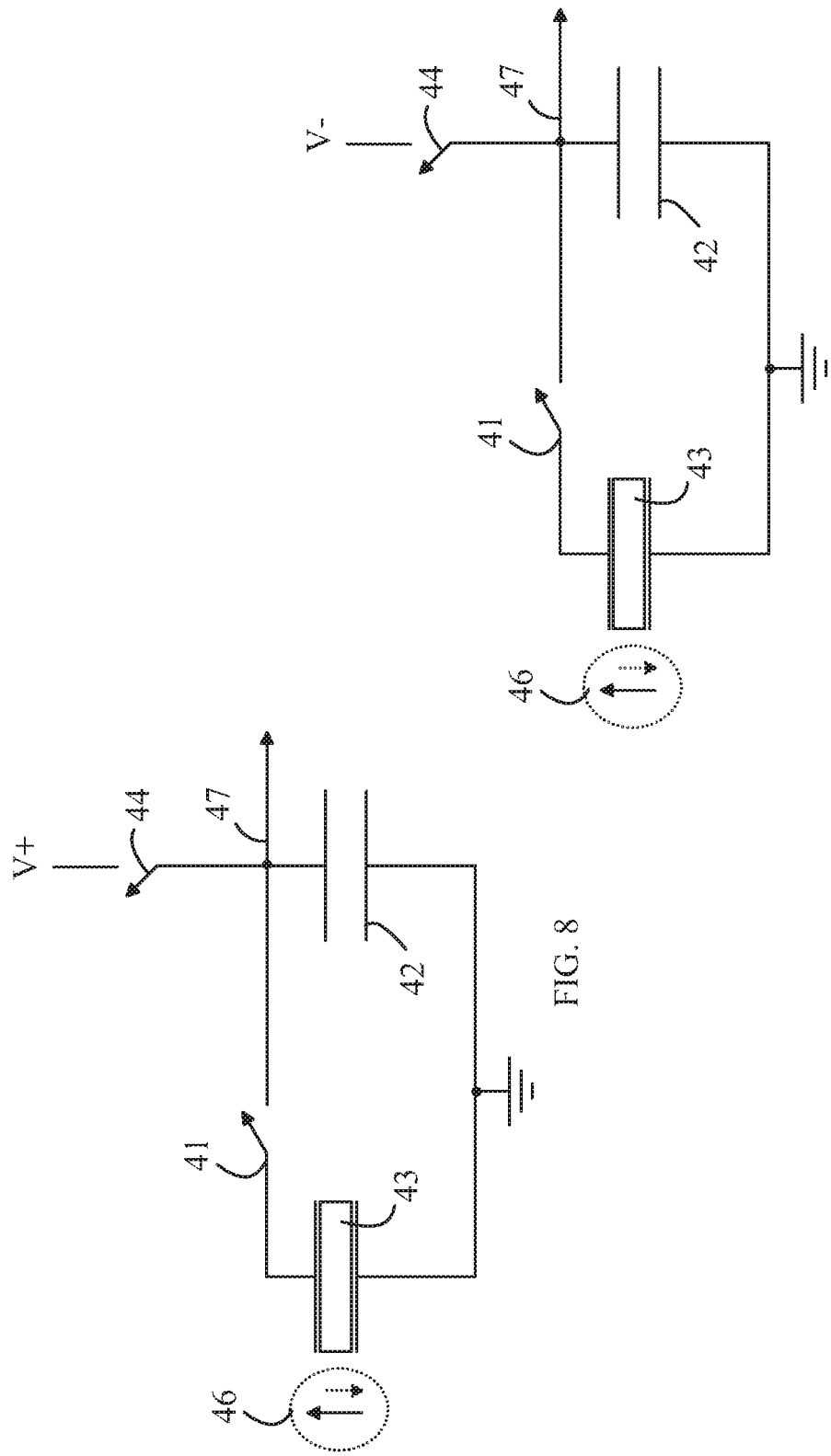

ANALOG FERROELECTRIC MEMORY WITH IMPROVED TEMPERATURE RANGE

BACKGROUND

Non-volatile memory is a necessary part of numerous data processing systems and the like. The memory holds the state of the machine, programs, and data during periods in which the machine and the memory are not powered. Memories based on rotating magnetic disks provide the least expensive read-write non-volatile memory. However, such mechanical memories are relatively slow to read and write. The speed of data storage and retrieval is determined by the latency time for the portion of the disk having the desired data to be positioned under the read/write heads and the speed with which the disk rotates.

Non-volatile memories based on EEPROM architectures substantially eliminate the latency period and parallel read-write designs have also reduced the read-write times in such memories. However, EEPROM memories are still much slower than conventional DRAM or SRAM memories. In addition, the cost of these memories per bit is still an order of magnitude higher than DRAM.

Non-volatile memories based on ferroelectric materials hold the promise of improving both the cost and speed of non-volatile memory. A conventional ferroelectric memory cell uses a capacitor with a ferroelectric dielectric to store data. The data is stored by altering the polarization of the ferroelectric dielectric. In the simplest form, a ferroelectric capacitor with the dielectric completely polarized in one direction represents a data value of "0" and the ferroelectric capacitor with the dielectric completely polarized in the other direction represents a "1". The data value is stored by applying a voltage across the ferroelectric capacitor that is sufficient to fully polarize the dielectric in the desired direction. The stored data value is read by applying a voltage in a direction that fully polarizes the ferroelectric capacitor in a predetermined direction and measuring the charge that flows from the ferroelectric capacitor. If the ferroelectric capacitor was already polarized in the predetermined direction very little charge moves between the plates of the ferroelectric capacitor; however, if the ferroelectric capacitor was polarized in the opposite direction a much larger charge flows between plates.

The cost of a ferroelectric memory could be significantly reduced if the number of bits of data that can be stored in a ferroelectric capacitor can be increased beyond the above described binary storage cells. The initial attempts to store multiple states in a single ferroelectric capacitor used programming voltages that were less than the voltages needed to fully polarize the ferroelectric capacitor. In these schemes, the ferroelectric capacitor is first reset to a fully polarized state by applying a reset voltage. The ferroelectric capacitor is then subjected to an intermediate voltage in the opposite direction to partially polarize the ferroelectric capacitor. The magnitude of the programming voltage depends on the data value that is to be stored. To read the ferroelectric capacitor, the ferroelectric capacitor is again subjected to the reset voltage and the amount of charge that leaves the ferroelectric capacitor is measured. The amount of charge that flows from the capacitor should allow the stored data value to be determined. Unfortunately, the amount of charge that flows depends on the hysteresis curve for the ferroelectric capacitor. The hysteresis curves vary significantly from ferroelectric capacitor to ferroelectric capacitor due to fabrication variations, the previous programming history of the ferroelectric capacitor, and temperature. Hence, the same programming voltage applied to different ferroelectric capacitors in a memory leads to different charges being stored.

In U.S. Pat. No. 7,990,749, which is incorporated in its entirety by reference, an improved analog ferroelectric memory is described in which the ferroelectric capacitors are programmed by converting the data value to be stored to a charge that depends only on the data value. This charge is then forced into the ferroelectric capacitor. Because of the variations in the hysteresis loops of the ferroelectric capacitors, the different ferroelectric capacitors will be in different states of polarization. However, when the ferroelectric capacitor is reset, the charge that leaves the ferroelectric capacitor will be the same as the charge that was forcibly stored provided the temperature of the ferroelectric capacitor at readout is the same as the temperature of the ferroelectric capacitor at programming, and hence, the variations in the hysteresis loop due to fabrication variation and programming history are substantially reduced.

SUMMARY

The present invention includes a ferroelectric memory and a method for operating a ferroelectric memory. A ferroelectric memory according to the present invention includes a ferroelectric memory cell and a write circuit. The ferroelectric memory cell includes a ferroelectric capacitor characterized by a maximum remanent charge, $Q_{max}$, that can be stored in the ferroelectric capacitor. The write circuit receives a write data value having more than two states for storage in the ferroelectric capacitor. The write circuit measures $Q_{max}$ for the ferroelectric capacitor, determines a first charge that is a fraction of the measured $Q_{max}$, and causes the first charge to be stored in the ferroelectric capacitor. The first charge is determined by the write data value, and $Q_{max}$.

In one aspect of the invention, the ferroelectric memory also includes a read circuit that determines a stored data value that is stored in the ferroelectric capacitor. The read circuit measures a second charge stored in the ferroelectric capacitor, measures $Q_{max}$ for the ferroelectric capacitor, and determines the stored data value from the second charge and the measured $Q_{max}$.

In another aspect of the invention, the ferroelectric memory includes a plurality of ferroelectric memory cells and a memory cell selection circuit. Each ferroelectric memory cell includes a ferroelectric capacitor characterized by a maximum remanent charge, $Q_{max}$, that can be stored in that ferroelectric capacitor. $Q_{max}$ is a function of temperature and may differ from ferroelectric capacitor to ferroelectric capacitor. The memory cell selection circuit selects one of the ferroelectric capacitors. The write circuit receives a third data value having more than two states for storage in the selected one of the ferroelectric capacitors. The write circuit measures $Q_{max}$ for the selected one of the ferroelectric capacitors, determines a third charge that is a fraction of the measured $Q_{max}$, and causes the third charge to be stored in one of the ferroelectric capacitors. The third charge is determined by the third data value.

In another aspect of the invention, the ferroelectric memory also includes a read circuit that determines a third data value stored in the selected one of the ferroelectric capacitors. The read circuit measures a fourth charge stored in that one of the ferroelectric capacitors, measures $Q_{max}$ for that one of the ferroelectric capacitors, and determines the third data value from a ratio of the fourth charge and the measured $Q_{max}$.

In a further aspect of the invention, the write circuit determines $Q_{max}$ each time the first charge is stored in the ferroelectric capacitor. In addition, the read circuit determines $Q_{max}$ each time the second charge stored in the ferroelectric capacitor is measured.

In another aspect of the invention, the ferroelectric capacitor includes a parasitic linear capacitor and the write circuit measures a fifth charge flowing from the ferroelectric capacitor when the ferroelectric capacitor is switched from a fully polarized state in one direction to a fully polarized state in the other direction. The fifth charge is corrected for a parasitic charge that was stored on the parasitic linear capacitor. The read circuit measures a fifth charge flowing from the ferroelectric capacitor when the ferroelectric capacitor is switched from a fully polarized state in one direction to a fully polarized state in the other direction and corrects the fifth charge for a parasitic charge that was stored on the parasitic linear capacitor.

In another aspect of the invention, the ferroelectric capacitor is characterized by first and second plates that sandwich a ferroelectric dielectric material, and the ferroelectric memory includes a shorting circuit that electrically connects the first and second plates when the write circuit is not causing the first charge to be stored in the ferroelectric capacitor or the read circuit is not measuring the second charge. The shorting circuit is inoperative when the read circuit is measuring the second charge or the write circuit is causing the first charge to be stored into the ferroelectric capacitor.

In a still further aspect of the invention, the ferroelectric memory is characterized by a maximum rate of temperature change for which the ferroelectric memory is designed to operate, and the ferroelectric capacitor includes a thermal package that limits the rate of change of temperature of the ferroelectric capacitor to the maximum rate.

In another aspect of the invention, the memory cell selection circuit includes a write line, a read line, and a plurality of ferroelectric memory cell select buses. One of the select buses corresponding to each of the ferroelectric memory cells. Each of the ferroelectric memory cells includes first and second gates for connecting the ferroelectric memory cell to the read line and the write line, respectively, in response to signals on the ferroelectric memory cell select bus corresponding to that ferroelectric memory cell.

In another aspect of the invention, each of the ferroelectric capacitors is characterized by first and second conducting plates, and each of the ferroelectric memory cells includes a discharge path connecting the first and second conducting plates. The discharge path has an impedance that prevents a voltage between the first and second conducting plates being generated that is greater than a disturb voltage when the ferroelectric memory cell is not selected, the discharge path having an impedance greater than a selection impedance when the ferroelectric memory cell is selected. The disturb voltage is less than a voltage that would alter the charge stored in the ferroelectric capacitor by more than an amount that would alter a data value stored in the ferroelectric capacitor, and the selection impedance is greater than an impedance that would cause an error in reading a data value from, or writing a data value to, the ferroelectric capacitor.

The present invention also includes a method for operating a ferroelectric memory cell having a ferroelectric capacitor characterized by a maximum remanent charge, $Q_{max}$, that can be stored in the ferroelectric capacitor. The method includes a write operation in which a write data value is received that is to be stored in the ferroelectric capacitor, the write data value having more than two states. The method includes measuring $Q_{max}$ for the ferroelectric capacitor, determining a first charge that is a fraction of the measured $Q_{max}$, and causing the first charge to be stored in the ferroelectric capacitor. The charge is determined by the write data value and $Q_{max}$.

In one aspect of the invention, $Q_{max}$ is measured prior to each write operation being performed.

In another aspect of the invention, the method includes a read operation. The read operation includes determining a second charge stored in the ferroelectric capacitor, determining $Q_{max}$ for the ferroelectric capacitor, and converting the determined $Q_{max}$ and the second charge to a data value, the data value having more than two possible states.

In another aspect, the ferroelectric capacitor includes a parasitic linear capacitor and wherein determining $Q_{max}$ includes measuring a third charge flowing from the ferroelectric capacitor when the ferroelectric capacitor is switched from a fully polarized state in one direction to a fully polarized state in the other direction. The third charge is corrected for a parasitic charge that was stored on the parasitic linear capacitor.

In another aspect, $Q_{max}$ is determined when each read operation is performed.

In another aspect, the ferroelectric capacitor is characterized by first and second conducting plates, and the method further includes providing a discharge path connecting the first and second conducting plates, the discharge path having an impedance that prevents a voltage between the first and second conducting plates is generated that is greater than a disturb voltage when the ferroelectric memory cell is not undergoing a read operation or a write operation. The disturb voltage is less than a voltage that would alter the charge stored in the ferroelectric capacitor by more than an amount that would alter a data value stored in the ferroelectric capacitor and the discharge path having an impedance that is greater than an impedance that would cause an error in the read operation or the write operation when the ferroelectric capacitor is undergoing the read operation or the write operation.

BRIEF DESCRIPTION OF THE DRAWINGS

FIG. 4 is a flow chart of a procedure for storing a data value, in a particular ferroelectric capacitor.

FIG. 5 is a flow chart of a procedure used to read a data value from a particular ferroelectric capacitor in a memory.

FIG. 8 illustrates a simplified circuit for reading the charge stored on the ferroelectric capacitor.

FIG. 9 is a simplified readout circuit according to another embodiment of the present invention.

DETAILED DESCRIPTION

The circuits discussed in this application include two types of capacitors. The first type is a ferroelectric capacitor, which is a capacitor with a ferroelectric material as the dielectric in that capacitor. The second type is a conventional capacitor, which has a non-ferroelectric material as its dielectric layer. The term capacitor, without the adjective "ferroelectric" will be used for the conventional capacitor in the following discussion unless the context indicates otherwise.

The manner in which the present invention provides its advantages can be more easily understood with reference to the problems encountered by prior art ferroelectric capacitor memories that attempt to store more than two states per ferroelectric capacitor. Ferroelectric memories are based on a model in which data values are mapped to particular states of polarization of the ferroelectric dielectric by applying a write voltage across the ferroelectric capacitor that corresponds to each state. The polarization state of the dielectric is sensed by applying a read voltage across the ferroelectric capacitor that causes the dielectric to be fully polarized in a known direction and observing any charge that leaves one plate of the ferroelectric capacitor as a result of applying the read voltage.

Such schemes are complicated by the fact that the polarization state of a ferroelectric dielectric as a function of the applied voltage across the ferroelectric capacitor exhibits hysteresis. That is, the remanent polarization that is left in the ferroelectric capacitor when the voltage is removed is a function of the history of the voltage across the ferroelectric capacitor since the last time the ferroelectric capacitor was fully polarized. Hence, with the exception of two particular write voltages, merely applying a voltage that is between these write voltages does not lead to a reproducible state of polarization when the voltage is removed. The two write voltages that lead to known states of polarization independent of the previous short term history of the ferroelectric capacitor are the write voltages that fully polarize the dielectric in either the up or down directions. The voltage that provides this complete polarization is referred to as the saturation voltage and will be denoted by $V_c$. If a voltage that is greater than $V_c$ is used, no further remanent polarization takes place. If a voltage that is less than $V_c$ is used, the state of polarization will depend on the history of the ferroelectric capacitor prior to applying that write voltage.

As a result of the problems associated with using intermediate voltages, prior art ferroelectric memories based on ferroelectric capacitors are limited to two states that correspond to $V_c$ and $-V_c$ being used as the writing voltages for storing the data. Either of these voltages can be used as the read voltage.

Figure 1:
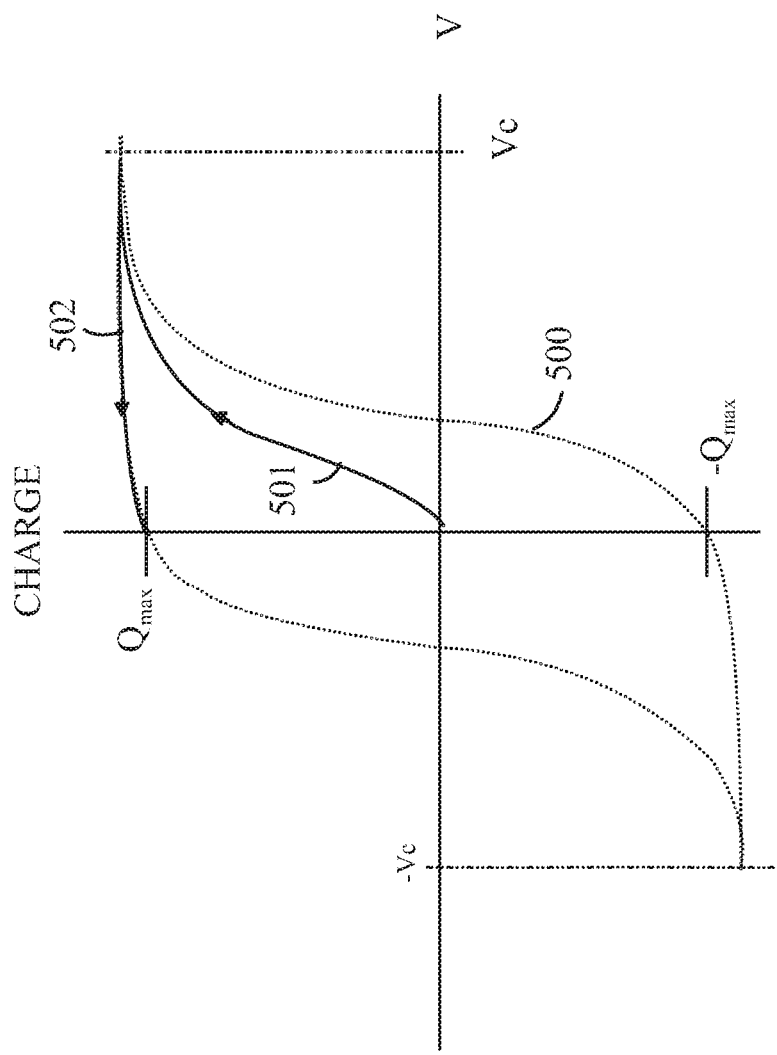
FIG. 1 illustrates the relationship between the applied voltages and the charge that is stored in the ferroelectric capacitor.

Schemes for using intermediate write voltages to set intermediate states of polarization have been proposed. To avoid the problems associated with the memory of the ferroelectric capacitor, the intermediate state is set by first setting the ferroelectric capacitor to one of the fully polarized states and then applying an intermediate write voltage that tends to polarize the ferroelectric capacitor in the opposite polarization state. Refer now to FIG. 1, which illustrates the relationship between the applied voltages and the charge that is stored in the ferroelectric capacitor. It should be noted that the charge stored on the capacitor electrodes is a direct measure of the polarization of the dielectric, since the charge is attracted onto the electrodes by the remanent polarization of the dielectric. When the ferroelectric capacitor is first fabricated, the ferroelectric material is not polarized. Consider the case in which a positive voltage of $V_c$ is applied across the capacitor. The charge in the ferroelectric capacitor increases along curve 501 until it reaches a maximum at $V_c$. If the voltage across the ferroelectric capacitor is now removed, the charge stored on the ferroelectric capacitor decreases to $Q_{max}$, along curve 502, which is part of the hysteresis loop 500. Here, $Q_{max}$ is the maximum remanent charge that is stored by the ferroelectric capacitor when no voltage is applied.

Figure 2:
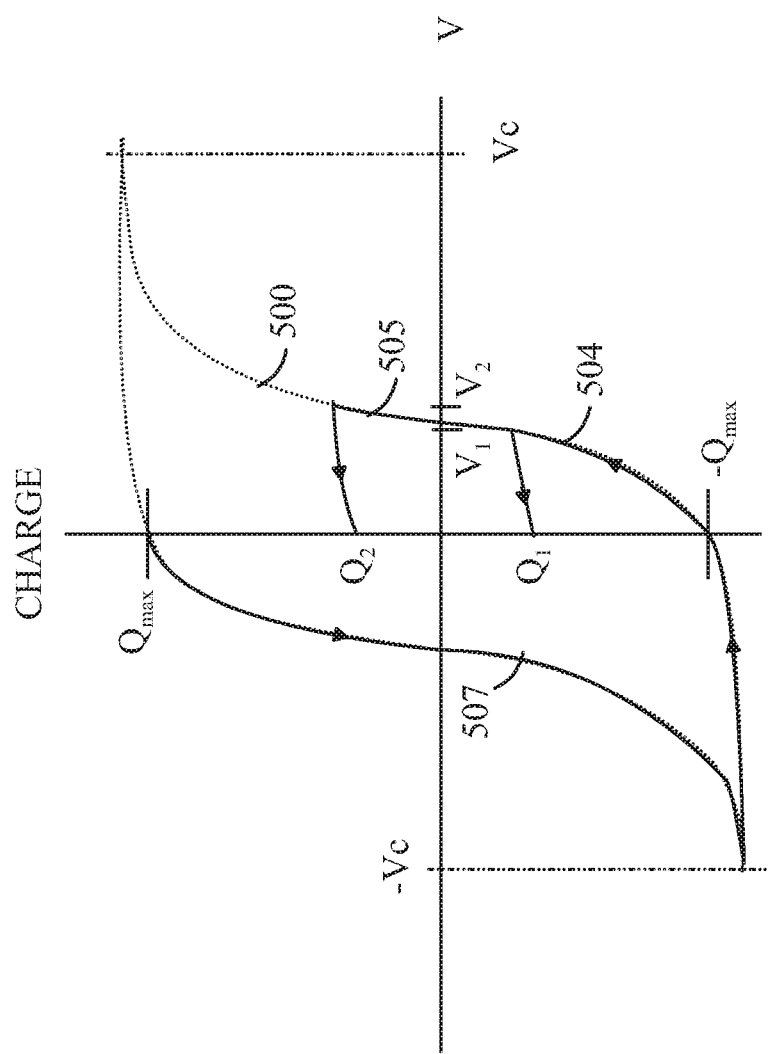
FIG. 2 illustrates the problems associated with trying to use an intermediate voltage to establish an intermediate polarization value.

Refer now to FIG. 2, which illustrates the problems associated with trying to use an intermediate voltage to establish an intermediate polarization value. The ferroelectric capacitor is assumed to start from the point at which it was left by the application of $V_c$ as discussed above. To establish the partial polarization, the ferroelectric capacitor is first cycled to $-V_c$ along curve 507 and then the voltage is increased from $-V_c$ to $V_1$. The charge as a function of voltage is shown at 504. Once the ferroelectric capacitor is established at $V_1$, the voltage is removed leaving a remanent charge of $Q_1$ in the ferroelectric capacitor. If a voltage of $V_2$ that was slightly higher than $V_1$ had been used, the polarization would continue along path 505 and the final remanent charge would be $Q_2$. Hence, a small change in the programming voltage results in a large change in the remanent charge. This problem arises from the steep slope of the hysteresis curve, which magnifies any errors in the programming voltage.

These schemes assume that the hysteresis loop that characterizes a particular ferroelectric capacitor remains constant and that the hysteresis loops of all ferroelectric capacitors in a memory are the same, since the programming voltage corresponding to a particular state that is to be stored in different ferroelectric capacitors cannot be programmed differently for the different ferroelectric capacitors. It is clear from FIG. 2 that the degree of remanent charge stored by an intermediate voltage is a sensitive function of the shape of the hysteresis loop characterizing that particular ferroelectric capacitor. Small changes in the shape or location of the hysteresis loop lead to large changes in the remanent charge that is left after the programming voltage is removed.

In the above-referenced US Patent, the problems associated with the variations in the hysteresis loops from ferroelectric capacitor to ferroelectric capacitor are overcome by programming the ferroelectric capacitors with a charge rather than a voltage. That is, a data value to be stored in the ferroelectric capacitor is converted to a charge and that charge is forced into the ferroelectric capacitor without regard to the particular hysteresis loop of that ferroelectric capacitor other than the maximum charge that can be stored in the ferroelectric capacitor. The differences in the hysteresis loops lead to different partial polarizations from ferroelectric capacitor to ferroelectric capacitor. When the ferroelectric capacitor is reset at readout, whatever charge that is stored in the ferroelectric capacitor is forced out regardless of the polarization level of the ferroelectric capacitor. Hence, the data value can be recovered. That is, the charge that corresponds to a particular data value will be the same independent of variations in the hysteresis loops of the various ferroelectric capacitors in the memory.

The above discussed programming strategy assumes that there is not a significant difference in the temperature of the ferroelectric capacitor between the time that the ferroelectric capacitor is programmed by forcing in the charge and the time the ferroelectric capacitor is read by resetting the ferroelectric capacitor to a fully charged state. After the charge is forced onto the ferroelectric capacitor, the charge is held in place by the electric field generated by the internal remanent polarization, and there is no external voltage difference between the plates of the ferroelectric capacitor. If the temperature of the ferroelectric capacitor changes, however, the remanent polarization will also change due the expansion or contraction of the physical dimensions of the electric dipoles within the ferroelectric material.

A ferroelectric capacitor contains within its volume a population of unit cells. Below the Curie Temperature, all ferroelectric unit cells are asymmetrical. The asymmetry of each unit cell creates a net polarization that emanates from the unit cell. In any perfect capacitor, 100% of the unit cells are identically polarized, aligned vertically, and can reverse their direction with the application of an external electrical force. In the real world, some fraction of the unit cells fit that description and the rest are fixed in place by defects or lattice stress. Only those unit cells that can switch direction will contribute to the remanent polarization as measured from outside of the capacitor. In summary, the remanent polarization measured from the outside of the capacitor during a switching operation is the sum of the polarization contributed by each switchable unit cell within the capacitor volume.

Electrical polarization exhibited by a ferroelectric capacitor is a surface effect. In a fully saturated state, the structurally enforced electrical polarization of all of the switchable unit cells will point towards one electrode or the other. A partially poled state can be achieved by putting the capacitor in the condition where a fraction of the surface unit cells point in one direction and the remaining unit cells point in the other. Applying a saturating voltage to the capacitor in one direction starting with the condition where the capacitor is in a partially switched condition will cause only those unit cells pointing towards the applied field to switch away from the applied field. Only the charge held by that fraction of the total remanent polarization will exit from the capacitor since the other unit cells will not switch.

The present invention is based on the observation that when the temperature changes, the remanent polarization of each unit cell changes in response to the temperature change but the total population of units cells remains the same. That is, the unit cells do not change orientation, only the electric field generated by each unit cell changes in magnitude. An analog state according to the present invention is defined by the fraction of the unit cells that are polarized in a specified direction. This analog state is independent of changes in temperature between the time the ferroelectric capacitor was programmed and the time the fraction is determined at reading provided the ferroelectric capacitor is protected from rapid temperature change.

The polarization change occurs because the dimensions of the unit cells are temperature dependent. The fraction of unit cells in a specific polarization direction does not change. For example, if 60% of the unit cells are programmed in one direction in an analog state and the temperature changes, the total remanent polarization of the capacitor will change because the unit cells change their size, and hence, their individual contribution to the total remanent polarization; however, the 60% ratio of UP to DOWN unit cells remains intact. This assumption is true as long as all pyroelectric effects and thermomechanical effects arising from the temperature change are not allowed to apply force to the unit cells to change their relative orientations. Since the ratio of unit cell directions remains unchanged by temperature change, that ratio can be determined by comparing the charge released when the ferroelectric capacitor with an unknown analog state is switched to a fully polarized state to the charge that is released when the ferroelectric capacitor is switched from one fully polarized state to the opposite fully polarized state. The second measurement provides a measure of the maximum charge that can be stored at the read temperature. The first measurement provides a measure of the charge stored in the capacitor at the read temperature. Since both of these charges change in the same manner with temperature, the ratio represents the fraction of the unit cells that are polarized in the desired direction.

Figure 3:
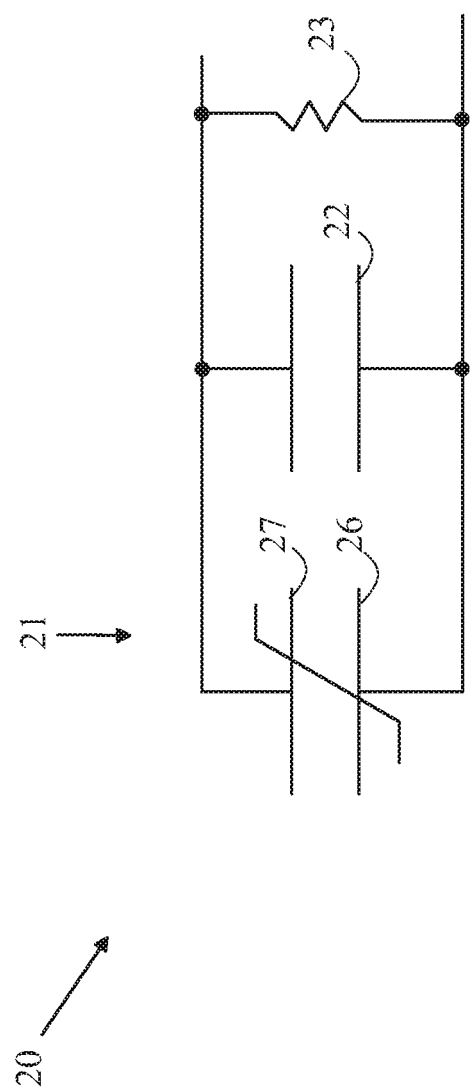
FIG. 3 is a schematic of a real ferroelectric capacitor, as opposed to the ideal ferroelectric capacitor whose hysteresis loop is shown in FIG. 1.

Refer now FIG. 3, which is a schematic of a real ferroelectric capacitor, as opposed to the ideal ferroelectric capacitor whose hysteresis loop is shown in FIG. 1. Ferroelectric capacitor 20 includes an ideal ferroelectric capacitor 21, a non-ferroelectric capacitor 22, and a leakage resistor 23. Assume that ideal ferroelectric capacitor 21 has been partially polarized by forcing electrons onto plate 27. If the temperature increases, the remanent polarization will decrease and electrons will leave plate 27 and be stored temporarily on linear capacitor 22. This gives rise to a voltage across leakage resistor 23, which will force the electrons to move to plate 26. For the purpose of the present discussion, it will be assumed that the voltage induced across linear capacitor 22 is so small that the voltage does not alter the fraction of the unit cells polarized in a specific direction. The electrons stored on linear capacitor 22 will be driven to plate 26 by the voltage difference across linear capacitor 22. At this point, the charge stored on ideal ferroelectric capacitor 21 is less than that stored during the programming. Hence, if ferroelectric capacitor 20 were readout at the new temperature, and the state of the data stored in ferroelectric capacitor 20 was inferred from the charge, an incorrect data value would be read. The magnitude of the error would depend on the magnitude of the temperature change and the properties of the ferroelectric capacitor.

It should be noted that if, instead of reading the ferroelectric capacitor at the new temperature, the temperature is returned to the temperature that was present at programming, the polarization of the ferroelectric material will increase, and the electrons will be forced back onto plate 27. If the ferroelectric capacitor is now read, the correct charge will be observed. Hence, provided the rate of temperature during the data storage period is small, the charge read from the device depends only on the charge stored in the device and the difference in temperature between the programming temperature and the reading of the temperature. It should be noted that analog ferroelectric memories based on using intermediate programming voltages also suffer from the temperature problem.

In the above-described system, a data value to be stored is converted to a charge that is independent of the properties of the particular ferroelectric capacitor in which the charge is to be stored. The present invention is based on the observation that the temperature problem can be eliminated by converting a data value to a percentage of the maximum charge that can be stored in the particular ferroelectric capacitor in which the data value is to be stored.

At any temperature, there is a maximum remanent polarization, and hence, a maximum charge that can be stored in the ferroelectric capacitor. Denote this maximum charge by $Q_{max}$. When $Q_{max}$ is stored, all of the switchable domains are pointing in the same direction. This maximum charge will vary from ferroelectric capacitor to ferroelectric capacitor in a multi-ferroelectric capacitor memory even when the ferroelectric capacitors are all at the same temperature. The maximum charge also varies over the life of the ferroelectric capacitor and the history of the particular ferroelectric capacitor. Denote the number of states to be stored in the ferroelectric capacitor by Ns, where Ns>2. For notational convenience, the states will be numbered from 0 to Ns−1. In one aspect of the invention, each state corresponds to a different fraction of $Q_{max}$ being stored. That is, state n corresponds to a charge of $(n/Ns)Q_{max}$ being stored on the ferroelectric capacitor. While this example uses a linear relationship between the fraction of the maximum charge stored and the state number, other relationships could be utilized provided the relationship between the state and the fraction of $Q_{max}$ stored is monotonic. The factors that determine the maximum value of Ns will be discussed in more detail below.

To store a data value in a particular ferroelectric capacitor, the current value of $Q_{max}$ for that ferroelectric capacitor must be known. Hence, prior to each write, $Q_{max}$ must be determined. Typically, the data value is an integer, and hence, the data value must be converted to a fraction that is scaled by $Q_{max}$ to arrive at the absolute charge that is to be forced into the ferroelectric capacitor.

Refer now to FIG. 4, which is a flow chart of a procedure for storing a data value, in a particular ferroelectric capacitor. The process begins by converting the data value to a fraction of $Q_{max}$ as shown at 450. Next the $Q_{max}$ for the particular ferroelectric capacitor in which the data value is to be stored is determined as shown at 451. $Q_{max}$ can be measured by resetting the ferroelectric capacitor to a fully polarized state in one direction and then measuring the charge that flows between the plates of the ferroelectric capacitor when the polarization is switched such that the ferroelectric capacitor is fully polarized in the opposite direction. It should be noted that at the end of this step, the ferroelectric capacitor will be fully polarized. This polarization state will be referred to as the DOWN state in the following discussion.

Next, the charge that is to be forced onto the ferroelectric capacitor is determined by multiplying the fraction determined in step 450 by the measured value of $Q_{max}$ as shown at 452. Finally, the charge determined in step 452 is forced onto the ferroelectric capacitor as shown at 453. The charge is forced onto the plate of the ferroelectric capacitor such that the charge reduces the polarization of the ferroelectric capacitor. That is, the charge partially moves the polarization of the ferroelectric capacitor in the UP direction.

Refer now to FIG. 5, which is a flow chart of a procedure used to read a data value from a particular ferroelectric capacitor in a memory. The procedure starts by measuring the charge currently stored in the ferroelectric capacitor in question as shown at 454. As will be explained in more detail below, the charge can be measured by resetting the ferroelectric capacitor to the fully polarized DOWN state and measuring the charge that flows between the plates of the ferroelectric capacitor. Alternately, the stored charge can be measured by measuring the charge that must be added to the ferroelectric capacitor to bring the ferroelectric capacitor to a fully polarized UP state.

Next, $Q_{max}$ is measured for the ferroelectric capacitor as shown at 455. This can be accomplished by resetting the capacitor to the fully polarized UP state from the fully polarized DOWN state and then measuring the charge that flows between the plates when the polarization is flipped to the fully polarized DOWN state. Finally, the data value is determined by calculating the ratio of the measured charge to the measured value of $Q_{max}$ and converting that fraction to the corresponding data value as shown at 456. It should be noted that in a "read-write" operation in which a data value is read from a particular ferroelectric capacitor and then a new data value is immediately stored in that ferroelectric capacitor, the $Q_{max}$ value for the ferroelectric capacitor from the read operation can be used for the following write operation. In addition, the ferroelectric capacitor will already be in the fully polarized DOWN state at the end of the read operation.

The percentage change in polarization with temperature is the same for all states. Hence, normalizing the charge to $Q_{max}$ removes variations resulting from the read and write operations being performed at different temperatures provided that once the ferroelectric capacitor is programmed, the rate of temperature change as a function of time is "small". The current flowing between the plates of the ferroelectric capacitor is a function of the rate of change of the dielectric temperature. In the absence of some external leakage path, that current must pass through leakage resistor 23 shown in FIG. 3. To force that current through leakage resistor 23, a voltage must be maintained across leakage resistor 23. The charge expelled from the ferroelectric capacitor provides this voltage. If that voltage is a significant fraction of the coercive voltage of the ferroelectric capacitor, the polarization of the ferroelectric capacitor will be altered, which will lead to an error when the ferroelectric capacitor is read out. For example, a voltage that would move the polarization by more than half the difference in the polarization of adjacent data states poses a significant problem. As will be discussed in more detail below, such a voltage build-up can be avoided by providing a current path between the plates of the ferroelectric capacitor during the time the ferroelectric capacitor is storing the charge and is subject to temperature changes that could result in an error.

Figure 6:
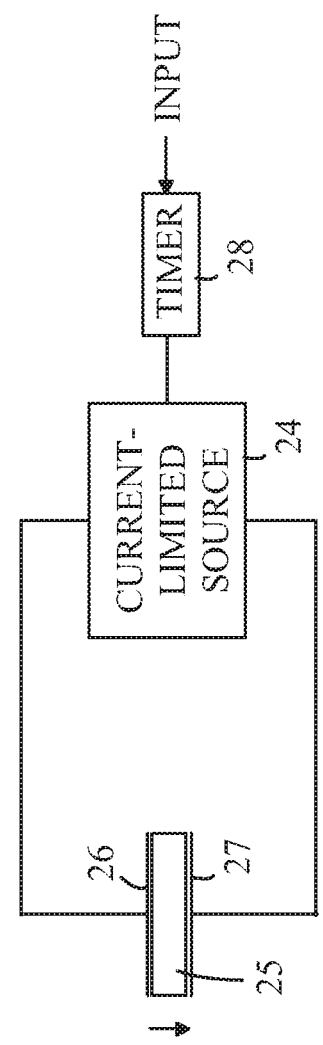
FIG. 6 illustrates the basic programming principle used in one embodiment of the present invention.

The above-described procedure relies on being able to force a predetermined charge into the ferroelectric capacitor to program it to a known intermediate polarization state. The above described US Patent provides details on forcing a known charge onto a ferroelectric capacitor. Refer now to FIG. 6, which illustrates the basic programming principle used in one embodiment of the present invention. At the beginning of the programming cycle, ferroelectric capacitor 25 is programmed in the DOWN direction as indicated by the arrow. This is accomplished by increasing the potential of plate 26 relative to plate 27 by an amount that fully polarizes the dielectric layer in the indicated direction using current-limiting source 24.

To set an intermediate polarization state, current-limiting source 24 applies the opposite potential across ferroelectric capacitor 25; however, the current that is allowed to flow is limited so that the time to completely flip the polarization is extended beyond the time that would normally be needed if a non-limited current source were used. The present invention is based on the observation that ferroelectric capacitor 25 will be left in an intermediate polarization state if the process is terminated before the polarization has completely flipped. Hence, if current-limiting source 24 is a constant current source, the state of polarization of ferroelectric capacitor 25 will be a function of the programming time. For example, a timer 28 that determines the length of time that current-limiting source 24 is on can be used to convert an input value to the intermediate polarization state.

Figure 7:
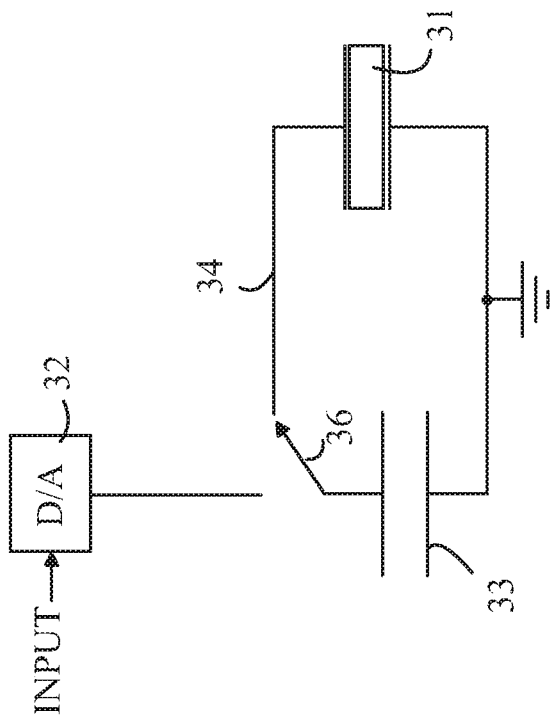
FIG. 7 illustrates another programming arrangement that could be utilized in an embodiment of the present invention.

Refer now to FIG. 7, which illustrates another programming arrangement that could be utilized in an embodiment of the present invention. In this embodiment, a digital-to-analog converter 32 is used to convert the input value to a voltage that is applied to ferroelectric capacitor 33 when switch 36 is set to connect digital-to-analog converter 32 to ferroelectric capacitor 33. This leaves a known charge on ferroelectric capacitor 33. After ferroelectric capacitor 33 is charged, switch 36 is used to connect ferroelectric capacitor 33 to ferroelectric capacitor 31, which has already been reset. Charge from ferroelectric capacitor 33 then flows into ferroelectric capacitor 31. Denote the voltage on ferroelectric capacitor 33 prior to switching by $V_1$, and denote the voltage on line 34 after switching by $V_2$. Then the charge transferred to ferroelectric capacitor 31 is $C(V_1-V_2)$, where C is the capacitance of ferroelectric capacitor 33. If $V_1 \gg V_2$, the transferred charge is proportional to the input value for a linear digital-to-analog converter. In either case, a calibration curve can be provided that maps the input state to the amount of charge that is transferred. Alternatively, digital-to-analog converter 32 can utilize a non-linear transfer function to compensate for $V_2$.

It should be noted that the combination of current-limiting source 24 and timer 28 shown in FIG. 6 or the combination of digital-to-analog converter 32, switch 36, and ferroelectric capacitor 33 shown in FIG. 7 can each be viewed as a "charge source" that transfers a known charge to the ferroelectric capacitor that is determined by the data value. The amount of charge transferred is independent of the hysteresis curves and saturation voltages of the ferroelectric capacitors in question, provided the charge is less than the maximum charge, $Q_{max}$. Consider two different ferroelectric capacitors having slightly different $Q_{max}$ values and/or slightly different hysteresis curves. When a charge of Q is forced into each of the capacitors, the capacitors will have slightly different coordinates on their respective hysteresis curves that result from differences in properties of the ferroelectric capacitors even though the ferroelectric capacitors store the same charge. Hence, transferring a fixed charge is not equivalent to programming the ferroelectric capacitor with a voltage corresponding to a data value to be stored.

Refer now to FIG. 8, which illustrates a simplified circuit for reading the charge stored on the ferroelectric capacitor. For the purposes of this discussion, it is assumed that ferroelectric capacitor 43 was reset to an UP polarization as shown by the solid arrow at 46. Data was then stored in ferroelectric capacitor 43 by storing a charge that caused the polarization to decrease in the direction of the dotted arrow. The goal of the readout circuit is to measure that charge when ferroelectric capacitor 43 is again reset to the UP state by providing a readout voltage that is a monotonic function of the stored charge.

The readout operation begins with switch 41 open and switch 44 closed such that linear capacitor 42 is charged to a potential of V+. After linear capacitor 42 is charged, switch 44 is opened, and switch 41 is closed. Initially, ferroelectric capacitor 43 will have a potential of V+ across the ferroelectric capacitor. If V+ is sufficiently high, ferroelectric capacitor 43 will be reset to the UP state and the charge, Q, that was stored in ferroelectric capacitor 43 will move to linear capacitor 42, thereby lowering the potential on linear capacitor 42 by an amount equal to Q/C, where C is the capacitance of linear capacitor 42. Hence, the voltage on line 47 will be a function of the charge that was stored on ferroelectric capacitor 43. For this readout scheme to operate over the full range of charges that can be stored on ferroelectric capacitor 43, V+ must be greater than $Q_{max}/C+Vs$ where, Vs is the potential needed to fully reset ferroelectric capacitor 43. It should also be noted that ferroelectric capacitor 43 is reset in the UP state at the end of the readout operation.

The circuit shown in FIG. 8 can also be used to implement the second readout scheme if the V+ power supply is replaced by a V− power supply as shown in FIG. 9, which is a simplified readout circuit according to another embodiment of the present invention. This readout circuit operates in a manner analogous to that described above with reference to FIG. 8. First, switch 44 is closed while switch 41 is opened to charge linear capacitor 42. Switch 44 is then opened followed by switch 41 being closed. The potential is sufficient to cause ferroelectric capacitor 43 to become fully polarized in the DOWN direction. The charge needed to accomplish this is provided by linear capacitor 42. Hence, the difference in voltages on line 47 before and after switch 41 is closed is a measure of the charge needed to move the polarization of ferroelectric capacitor 43 from its partially polarized state to a fully DOWN state. In this scheme, ferroelectric capacitor 43 must then be reset to the UP polarization prior to re-programming.

The above-described procedures assume that the linear capacitor 22 shown in FIG. 3 has a negligible capacitance. Linear capacitor 22 will be referred to as a linear capacitor in the following discussion to distinguish it from an ideal ferroelectric capacitor. When the ferroelectric capacitor has voltage applied across its plates, some charge will be stored on the linear capacitor. This charge is held on the linear capacitor by the voltage difference. When the voltage is removed, the charge will dissipate through some leakage path, leaving just the remanent charge stored in the ferroelectric capacitor. Unless the context indicates otherwise, when this document refers to charge being stored on the ferroelectric capacitor, the charge in question is the remanent charge.

Figure 12:
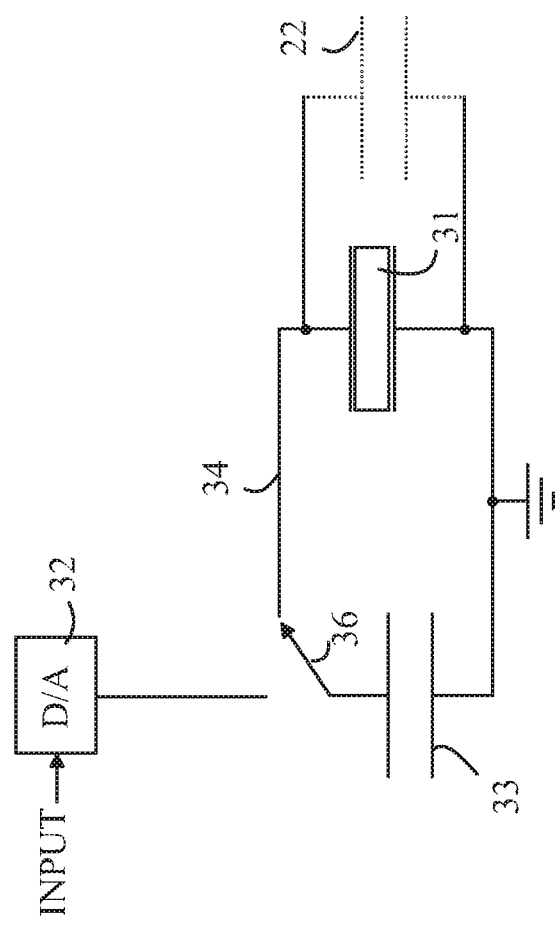
FIG. 12 illustrates the programming arrangement shown in FIG. 7 with the parasitic linear capacitor explicitly shown.

Refer now to FIG. 12, which illustrates the programming arrangement shown in FIG. 7 with the parasitic linear capacitor explicitly shown. In this case, it is assumed that the linear capacitance is not negligible, and hence, part of the charge transferred from ferroelectric capacitor 33 to ferroelectric capacitor 31 will reside on the linear capacitor 22 associated with the ideal ferroelectric capacitor 33, and not within the ferroelectric dielectric. The amount of charge that was left on the linear capacitor 22 must be determined to determine the actual charge bound by the remanent polarization within the ferroelectric capacitor. If there is a residual voltage on ferroelectric capacitor 33 after switch 36 has been connected to line 34, then there is charge stored on the linear capacitor 22. The amount of charge is the voltage on the line 34 times the capacitance of linear capacitor 22. However, the capacitance of linear capacitor 22 is not known at this point. To determine the capacitance, $C_L$, of linear capacitor 22, ferroelectric capacitor 33 is separated from line 34 and shorted to ground. Ferroelectric capacitor 33 is then reconnected to line 34. Ferroelectric capacitor 33 will now be at a new potential, $V_3$, because part of the charge stored on the linear capacitor 22 will be transferred to ferroelectric capacitor 33. The capacitance of linear capacitor 22 can then be determined from $C_L=C*V_3/(V_2-V_3)$, where C is the capacitance of ferroelectric capacitor 33. The charge that was stored in the ferroelectric material is then $C(V_1-V_2)-C_L*V_2$. This charge can then be used to determine any additional charge needed to bring the charge in the ferroelectric capacitor to the desired level.

Figure 13:
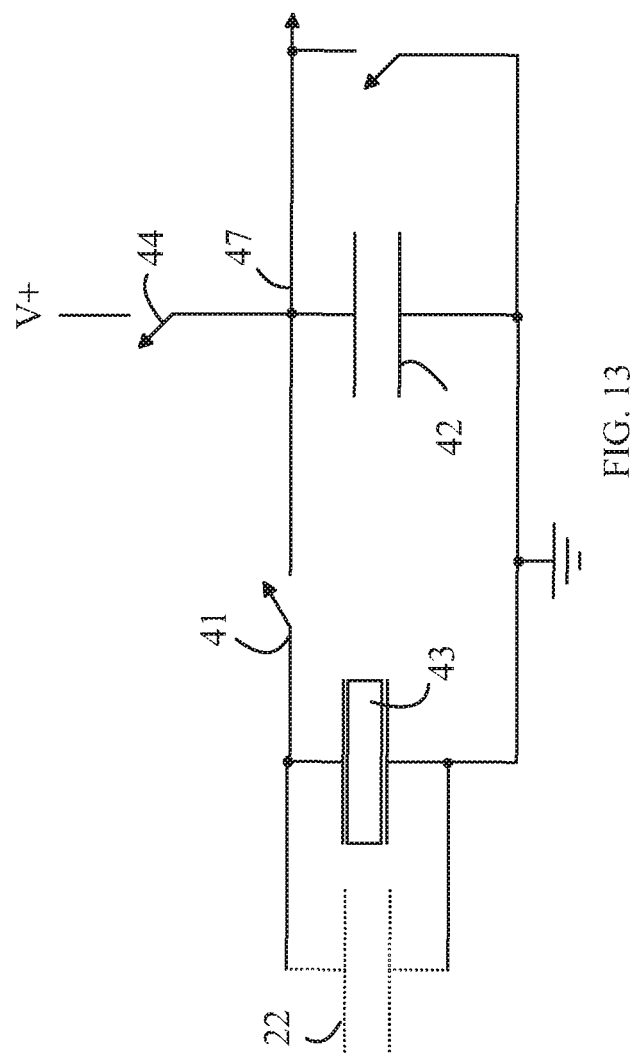
FIG. 13 illustrates the reading scheme shown in FIG. 8 with the parasitic linear capacitor associated with ferroelectric capacitor 43 explicitly shown as linear capacitor 22.

The parasitic linear capacitor associated with the ferroelectric capacitor can also introduce an error into the charge read from the ferroelectric capacitor. Refer now to FIG. 13 which illustrates the reading scheme shown in FIG. 8 with the parasitic linear capacitor associated with ferroelectric capacitor 43 explicitly shown as linear capacitor 22. In the reading scheme discussed with respect to FIG. 8, linear capacitor 42 is charged to V+ and then connected to ferroelectric capacitor 43 by closing switch 41. The charge stored in ferroelectric capacitor 43 is then moved to linear capacitor 42, lowering the voltage on line 47 to $V_2$. However, when switch 41 is closed, the capacitance of linear capacitor 42 is increased by $C_L$, since linear capacitor 22 is now in parallel with linear capacitor 42. The charge moved from ferroelectric capacitor 43 is then $(C_{42}+C_L)\Delta V$, where $C_{42}$ is the capacitance for linear capacitor 42 and $\Delta V$ is the change in voltage on line 47 when switch 41 is closed. Hence, an estimate of $C_L$ is again required to arrive at the correct amount of charge if $C_L$ is a significant fraction of the capacitance.

A measure of $C_L$ can be obtained using a procedure analogous to that discussed above in the write operation. Once ferroelectric capacitor 43 is connected to line 47 after linear capacitor 42 is precharged, all of the charge associated with the remanent polarization is removed from ferroelectric capacitor 43 and ferroelectric capacitor 43 is reset to a fully polarized UP state. Hence, if switch 41 is opened, any remaining charge on ferroelectric capacitor 43 is stored on linear capacitor 42. If linear capacitor 42 is shorted, and switch 41 closed again, part of the charge stored on linear capacitor 42 will flow onto linear capacitor 42, and the voltage on line 47 will increase to some new voltage, $V_3$. $C_L$ can then be computed from $C_L=V_3C_{42}/(V_2-V_3)$.

Figure 15:
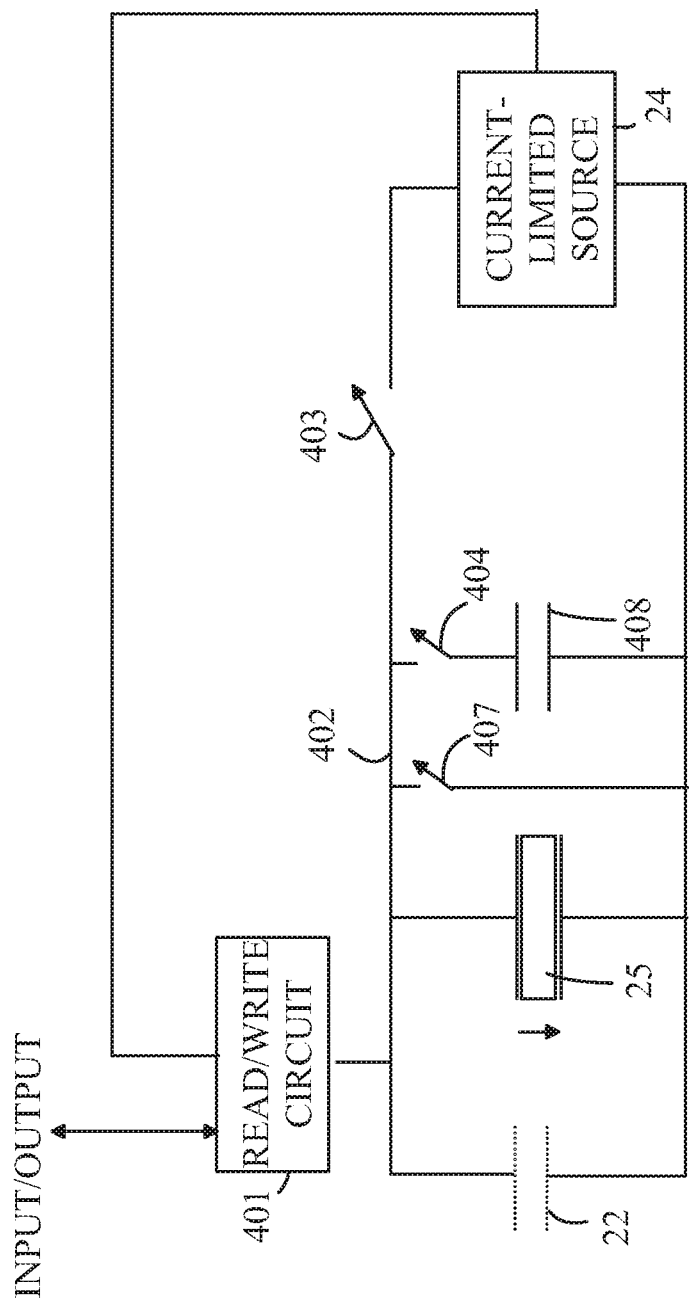
FIG. 15 illustrates an embodiment of the present invention that utilizes a constant current source to read and write the ferroelectric capacitor.

An analogous procedure can be used to correct for the parasitic linear capacitance in embodiments that utilize a constant current source to read and write the ferroelectric capacitor. Refer now to FIG. 15, which illustrates an embodiment of the present invention that utilizes a constant current source to read and write the ferroelectric capacitor. In the embodiment shown in FIG. 15, the parasitic linear capacitor associated with ferroelectric capacitor 25 is explicitly shown. Both the reading and writing of a data value require knowledge of $Q_{max}$ for ferroelectric capacitor 25. $Q_{max}$ is determined by resetting ferroelectric capacitor 25 to a fully polarized state and then measuring the charge that leaves ferroelectric capacitor 25 when ferroelectric capacitor 25 is switched to the opposite fully polarized state. To measure $Q_{max}$, read/write circuit 401 first applies a potential to line 402 that sets the polarization of ferroelectric capacitor to the fully polarized DOWN state as shown by the arrow next to ferroelectric capacitor 25. Any voltage across ferroelectric capacitor 25 due to charge stored on linear capacitor 22 is removed by shorting the plates of ferroelectric capacitor 25 together by closing switch 407. The charge needed to flip the polarization of ferroelectric capacitor 25 to the opposite fully polarized state is then determined by closing switch 403 and metering charge into ferroelectric capacitor 25 using current-limiting source 24. During this operation switches 404 and 407 remain open. When ferroelectric capacitor 25 becomes fully polarized no additional charge can be stored in ferroelectric capacitor 25, and hence, the voltage on line 402 begins to rise rapidly, as the only sink for the charge is linear capacitor 22 once ferroelectric capacitor 25 has been fully polarized. At this point, the charge that was delivered to ferroelectric capacitor 25 and linear capacitor 22 is determined from the known current and the time of charging. Next the charge that was stored on linear capacitor 22 is determined by opening switch 403, reading the voltage on line 402, and then closing switch 404 that places a known "sharing" capacitor 408 in parallel with linear capacitor 22. The voltage on line 402 will decrease due to the charge now being stored on a larger capacitor (i.e., the sum of the capacitances of capacitors 22 and 408). From the change in voltage, the capacitance $C_L$ of linear capacitor 22 can be determined in a manner similar to that discussed above. Given that capacitance, the value of $Q_{max}$ can be determined from the previously measured charge that was inserted into the combination of ferroelectric capacitor 25 and linear capacitor 22.

Data can be read from ferroelectric capacitor 25 by determining the charge that must be added to ferroelectric capacitor 25 to fully polarize ferroelectric capacitor 25 in the UP direction. This charge is the difference between the charge currently stored and $Q_{max}$. Hence, given $Q_{max}$, the charge stored in ferroelectric capacitor 25 can be determined. The procedure for measuring the charge to fully polarize ferroelectric capacitor 25 is essentially the same as that discussed above for determining $Q_{max}$, except that the polarization of ferroelectric capacitor 25 is not altered prior to adding charge via current-limiting source 24.

In the above examples, $C_L$ is computed at each read and write and for each ferroelectric capacitor in a memory array. However, the need to correct for $C_L$ depends on the number of levels being stored in a ferroelectric capacitor and the amount of charge that is stored on the parasitic linear capacitor during reading and writing operations. In addition, the need to calculate $C_L$ at each read and write depends on the degree of variability of $C_L$ over the memory array and with temperature. $C_L$ introduces an error in the charge being programmed into a ferroelectric capacitor and the charge being read from the ferroelectric capacitor. The successive polarization states are characterized by a charge that is stored for each state. If the charge error is small compared to the difference in charge between successive states, no further correction is required. In one aspect of the invention, the error will be considered small if the error is less than 0.25 times the difference in stored charge between successive levels.

In the simplest case. $C_L$ is assumed to be zero for all ferroelectric capacitors. If this leads to an error for a specific memory design, then the next level of correction would be to measure $C_L$ for each ferroelectric capacitor in the array at the time the array is manufactured and store an average $C_L$ value as part of the array calibration. In this case, the errors are determined by the variability of $C_L$ over the array and with temperature. If the resulting errors are still too large, then embodiments in which $C_L$ is measured at each read and write can be utilized.

Figure 10:
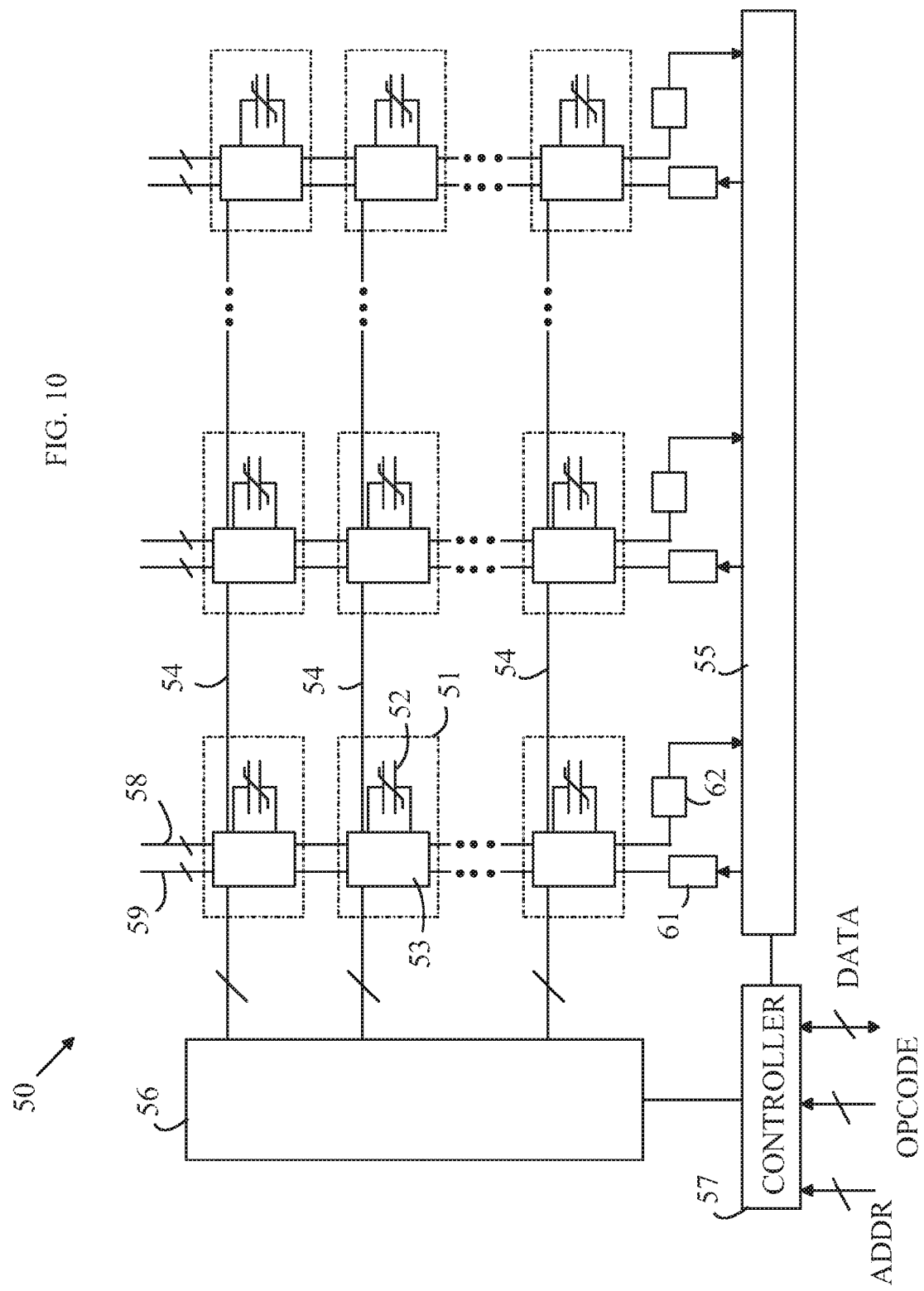
FIG. 10 illustrates one embodiment of an analog ferroelectric memory according to the present invention.

Refer now to FIG. 10, which illustrates one embodiment of an analog ferroelectric memory according to the present invention. Ferroelectric memory 50 includes a plurality of ferroelectric memory cells organized into a plurality of rows and columns. A typical ferroelectric memory cell is labeled at 51. Each ferroelectric memory cell includes a ferroelectric capacitor 52 and an interface circuit 53. All of the ferroelectric memory cells in a row are processed in parallel during read and write operations. The row to be processed is selected by a row select circuit 56 that operates a plurality of row select buses 54 that also include conductors for sequencing the row processing operations during reading and writing. Each ferroelectric memory cell in a given column is connected to two column buses shown at 58 and 59. Column bus 58 is used to readout the data stored in the ferroelectric capacitor in the ferroelectric memory cell being processed, and column bus 59 is used to program the ferroelectric capacitor in a new analog value. Each ferroelectric capacitor can be programmed to be in one of N states, where N>2. The state of a ferroelectric capacitor in a row being processed is ascertained by generating a signal on column bus 58 indicative of the amount of charge that was stored in that ferroelectric capacitor. This state is read using circuit 62. The state of a ferroelectric capacitor in a row being processed is set by applying signals to column bus 59 connected to that cell via write circuit 61. The signals cause a predetermined amount of charge that is related to the value to be stored in the ferroelectric memory cell to be stored in the ferroelectric capacitor in that ferroelectric memory cell.

Data that is read out of a row is stored in a row buffer 55. In one aspect of the invention, the data is converted from an analog signal representing the charge stored in the corresponding ferroelectric capacitors to a digital value. Since the readout process is destructive, this data must be restored to the row with a write operation even in cases in which no changes in the data are to be made. If changes are to be made, the changes are entered into row buffer 55 after the ferroelectric memory cells in the row have been reset. The data in row buffer 55 is then converted to a charge that is stored in the corresponding ferroelectric capacitors.

The read and write operations utilize a controller 57 that receives an address (ADDR), operation code (OPCODE), and data to be written to the ferroelectric memory cell(s) specified in the address. Data from the indicated address is output on the data lines. Row select circuit 56 applies the appropriate signals to the row select bus specified by the address.

Ferroelectric memory 50 includes two column buses for each column of memory cells, one for reading and one for writing. This arrangement simplifies the following discussion of the detailed embodiments. However embodiments in which only one column bus is needed can also be constructed.

Figure 11:
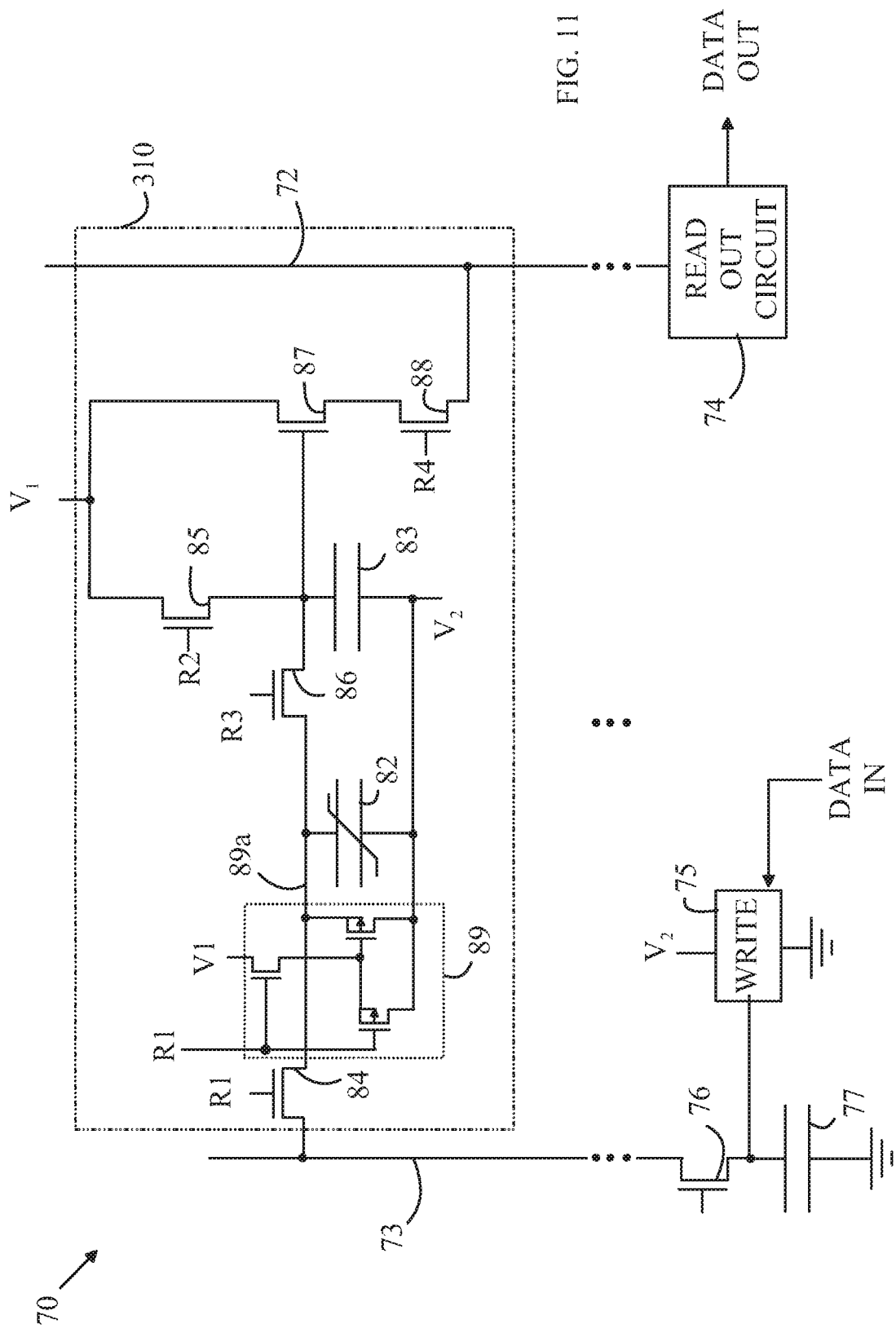
FIG. 11 illustrates one embodiment of a ferroelectric memory according to the present invention that utilizes a storage scheme in which data is readout by measuring the amount of charge that was stored in the ferroelectric capacitor during the writing operation.

Refer now to FIG. 11, which illustrates one embodiment of a ferroelectric memory according to the present invention that utilizes the storage scheme discussed above in which data is readout by measuring the amount of charge that was stored in the ferroelectric capacitor during the writing operation. To simplify the discussion, only one ferroelectric memory cell in ferroelectric memory 70 is shown. The four row lines R1-R4 are part of the row bus corresponding to the row of memory cells in which ferroelectric memory cell 310 is located.

Both the read and write operations require a knowledge of $Q_{max}$ for ferroelectric capacitor 82 at the time of reading or writing. In a write operation, the data stored in ferroelectric capacitor 82 will have already been read out. Hence, $Q_{max}$ can be measured for ferroelectric capacitor 82 by programming ferroelectric capacitor 82 to the fully DOWN state and then requesting readout circuit 74 to measure the charge that is released when ferroelectric capacitor 82 is subjected to a voltage that causes ferroelectric capacitor 82 to be fully polarized in the UP state. This operation leaves ferroelectric capacitor 82 polarized in the fully UP state. In a write operation, the value of $Q_{max}$ is communicated to write circuit 75, which then calculates the charge needed to program ferroelectric capacitor 82 from the received data value and the maximum number of data states that are to be stored in ferroelectric capacitor 82. A value is written into ferroelectric memory cell 310 by placing gate 84 in the conductive state and gate 86 in a non-conductive state. Capacitor 77 is then charged to a potential that will result in a charge having a value corresponding to the data being written being transferred to ferroelectric capacitor 82 when gate 76 is placed in a conducting state by write circuit 75. The voltage on capacitor 77 is less than $V_2$, by an amount that depends on the data value to be written. When ferroelectric capacitor 82 is connected to write line 73 through gate 84, the top plate will be at a potential that is less than the bottom plate, which is held at $V_2$, and hence, the write operation reverses part of the polarization created by the reset operation.

In a readout operation, $Q_{max}$ must be determined after the charge currently stored in ferroelectric capacitor 82 is determined. Data is read out of ferroelectric memory cell 310 in a three-step process by readout circuit 74 that is connected to read line 72 by gate 88. First, capacitor 83 is charged to $V_1$ while being isolated from ferroelectric capacitor 82 by gate 86. Gate 85 is utilized to connect capacitor 83 to $V_1$. Here, $V_1$ is greater than $V_2$ by an amount that allows the maximum design charge to be transferred to capacitor 83 and still have the top plate of capacitor 83 at a voltage greater than $V_2$. The final voltage on capacitor 83 is amplified by source follower 87 and readout by readout circuit 74 which stores the voltage on a capacitor within readout circuit 74. Next, gate 86 is placed in a conducting state with gate 84 off which applies voltage on capacitor 83 across ferroelectric capacitor 82. This resets ferroelectric capacitor 82 and causes the charge stored in ferroelectric capacitor 82 to be released, which, in turn, lowers the voltage at the gate of source follower 87. This voltage is then read by readout circuit 74 and subtracted from the voltage stored previously to arrive at a voltage difference that is indicative of the charge that was released by ferroelectric capacitor 82. Finally, $Q_{max}$ is determined. Ferroelectric capacitor 82 is programmed to the fully polarized DOWN state again and the readout process is repeated to determine $Q_{max}$. The ratio of $Q_{max}$ to the Q measured from the first two steps is then digitized to provide the output data.

As noted above, if rapid temperature swings are anticipated during the operation of the ferroelectric memory and during the times at which the ferroelectric memory is not powered, it is advantageous to limit the voltages that can be generated between the plates of the ferroelectric capacitor during these temperature swings by the pyroelectric effect present in ferroelectric capacitors. In one aspect of the present invention, an optional, shorting circuit 89 is connected between the plates of ferroelectric capacitor 82 to limit the voltage across ferroelectric capacitor 82 when no voltage is applied to ferroelectric memory cell 310.

In this exemplary shorting circuit, each transistor in shorting circuit 89 is normally conducting, but turns off if a positive voltage is applied across the gate of the transistor. During powered operation when ferroelectric memory cell 310 is selected, the voltage on line 89a can swing both above and below $V_2$. If the voltage is above $V_2$ one of the transistors will be off. If it goes below $V_2$, the other transistor will be off. Hence, the plates of ferroelectric capacitor 82 will not be shorted during reading and writing. If power is turned off, the $V_2$ power line and RI will be at zero volts, and hence all three of the transistors will be conducting, and the plates will be shorted to prevent temperature changes from inducing voltages across ferroelectric capacitor 82 that are sufficient to alter the stored data value.

Typically, the read and write times of a memory according to the present invention will be much shorter than the time over which a temperature change occurs. In this case, shorting circuit 89 can be replaced by a properly sized resistor. The resistor would need to have an RC time constant that is large compared to the read and write times. Here the capacitance is the parasitic capacitance of ferroelectric capacitor 82. The resistor would need to be small enough to allow any charge leaving ferroelectric capacitor 82 to move to the opposite plate of ferroelectric capacitor 82 without generating a voltage across the resistor that is sufficient to change the data value stored in ferroelectric capacitor 82.

Figure 14:
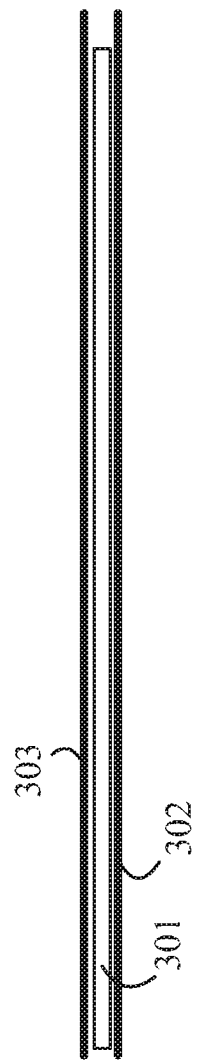
FIG. 14 is a cross-sectional view of memory according to one embodiment of the present invention that is packaged in a manner that reduces the rate at which the temperature of the memory can be changed.

As noted above, the problem with data being disturbed during a temperature shift depends on the rate of temperature change of the ferroelectric capacitor. If the rate of temperature change can be limited, the problems associated with data alteration can be significantly reduced. Typically, the temperature change of most concern is a shift in the air temperature. The rate of temperature change of the ferroelectric capacitor depends on the thermal mass of the memory circuit. If the thermal mass is sufficiently large, or a thermal resistance layer separates the memory circuit from the environment, the rate at which the unpowered circuit can be shifted in temperature can be kept below the rate that would disturb the data for any given memory design. Refer now to FIG. 14, which is a cross-sectional view of memory according to one embodiment of the present invention that is packaged in a manner that reduces the rate at which the temperature of the memory can be changed. A memory circuit 301 is sandwiched between layers 302 and 303. In one embodiment, layers 303 and 302 are thermal conductors with sufficient thermal mass to reduce the rate of temperature change of memory circuit 301 while allowing heat to flow from memory circuit 301 to the outside environment. This embodiment allows the heat generated in memory circuit 301 during powered operation to escape while limiting the rate of temperature change, since layers 302 and 303 act as heat sinks. Here, it is assumed that memory circuit 301 or layers 302 and 303 include insulating layers that prevent shorts in memory circuit 301.

In another embodiment, layers 302 and 303 are thermal insulators that provide a sufficient thermal resistance to limit the rate of temperature change during periods in which memory circuit 301 is not powered.

It should be noted that memory systems that split the read and write functions into separate components can also be constructed. The system could include three components, a write unit, a memory module that includes the ferroelectric capacitors, and a read unit. A removable memory module is adapted to plug into the write unit for programming. The removable module would then be removed and transported to the read unit for reading. This type of system is adapted for situations in which a large number of write stations accumulate data over a period of time. The write modules are then sent to a common read station that is part of a processing system the reads out the data and processes that data.

The above described embodiments use the terms UP and DOWN to describe the direction of polarization of the dielectric in the ferroelectric capacitor. However, it is to be understood that these are just convenient labels that have no connection to the Earth.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A ferroelectric memory comprising:
   a ferroelectric memory cell comprising a ferroelectric capacitor characterized by a maximum remanent charge, Qmax; and
   a write circuit that receives a write data value having more than two states for storage in said ferroelectric capacitor, said write circuit measuring Qmax for said ferroelectric capacitor, determining a first charge that is a fraction of said measured Qmax, said first charge being determined by said write data value, said write circuit causing said first charge to be stored in said ferroelectric capacitor.

2. The ferroelectric memory of claim 1 further comprising a read circuit that determines a stored data value that is stored in said ferroelectric capacitor, said read circuit measuring a second charge stored in said ferroelectric capacitor, measuring $Q_{max}$ for said ferroelectric capacitor, and determining said stored data value from said second charge and said measured $Q_{max}$.

3. The ferroelectric memory of claim 1 further comprising:
   a plurality of ferroelectric memory cells, each ferroelectric memory cell comprising a ferroelectric capacitor characterized by a maximum remanent charge, Qmax; and
   a memory cell selection circuit that selects one of said ferroelectric capacitors, said write circuit receiving a third data value having more than two states for storage in said one of said ferroelectric capacitors, said write circuit measuring Qmax for said one of said ferroelectric capacitors, determining a third charge that is a fraction of said measured Qmax, and causing said third charge to be stored in said one of said ferroelectric capacitors, said third charge being determined by said third data value.

4. The ferroelectric memory of claim 3 further comprising a read circuit that determines a third data value stored in said one of said ferroelectric capacitors, said read circuit measuring a fourth charge stored in said one of said ferroelectric capacitors, measuring $Q_{max}$ for said one of said ferroelectric capacitors, and determining said third data value from a ratio of said fourth charge and said measured $Q_{max}$.

5. The ferroelectric memory of claim 1 wherein said write circuit determines $Q_{max}$ each time said first charge is stored in said ferroelectric capacitor.

6. The ferroelectric memory of claim 5 wherein said ferroelectric capacitor comprises a parasitic linear capacitor and wherein said write circuit measures a fifth charge flowing from said ferroelectric capacitor when said ferroelectric capacitor is switched from a fully polarized state in one direction to a fully polarized state in an opposite direction, said fifth charge being corrected for a parasitic charge that was stored on said parasitic linear capacitor.

7. The ferroelectric memory of claim 2 wherein said read circuit determines $Q_{max}$ each time said second charge stored in said ferroelectric capacitor is measured.

8. The ferroelectric memory of claim 7 wherein said ferroelectric capacitor comprises a parasitic linear capacitor and wherein said read circuit measures a fifth charge flowing from said ferroelectric capacitor when said ferroelectric capacitor is switched from a fully polarized state in one direction to a fully polarized state in an opposite direction, said fifth charge being corrected for a parasitic charge that was stored on said parasitic linear capacitor.

9. The ferroelectric memory of claim 2 wherein said ferroelectric capacitor is characterized by first and second plates that sandwich a ferroelectric dielectric material, said ferroelectric memory comprising a shorting circuit that electrically connects said first and second plates when said write circuit is not causing said first charge to be stored in said ferroelectric capacitor or said read circuit is not measuring said second charge, said shorting circuit being inoperative when said read circuit is causing measuring said second charge or said write circuit causing said first charge to be stored into said ferroelectric capacitor.

10. The ferroelectric memory of claim 2 characterized by a maximum rate of temperature change for which said ferroelectric memory is designed to operate and wherein said ferroelectric capacitor comprises a thermal package that limits temperature changes of said ferroelectric capacitor to said maximum rate.

11. The ferroelectric memory of claim 3 wherein said memory cell selection circuit comprises:
a write line;
a read line; and
a plurality of ferroelectric memory cell select buses, one of said select buses corresponding to each of said plurality of ferroelectric memory cells, each of said plurality of ferroelectric memory cells comprising first and second gates for connecting said ferroelectric memory cell to said read line and said write line, respectively, in response to signals on said one of said ferroelectric memory cell select busses corresponding to that ferroelectric memory cell.

12. The ferroelectric memory of claim 3 wherein each of said ferroelectric capacitors is characterized by first and second conducting plates and each of said ferroelectric memory cells comprises a discharge path connecting said first and second conducting plates, said discharge path having an impedance that prevents a voltage between said first and second conducting plates being generated that is greater than a disturb voltage when said ferroelectric memory cell is not selected, said discharge path having an impedance greater than a selection impedance when said ferroelectric memory cell is selected, said disturb voltage being less than a voltage that would alter a charge stored in said ferroelectric capacitor by more than an amount that would alter a data value stored in said ferroelectric capacitor and said selection impedance being greater than an impedance that would cause an error in reading a data value from, or writing a data value to said ferroelectric capacitor.

13. A method for operating a ferroelectric memory cell comprising a ferroelectric capacitor, said ferroelectric capacitor being characterized by a maximum remanent charge, Qmax, said method comprising:
a write operation comprising:
receiving a write data value to be stored in said ferroelectric capacitor, said write data value having more than two states;
measuring Qmax for said ferroelectric capacitor;
determining a first charge that is a fraction of said measured Qmax, said charge being determined by said write data value; and
causing said first charge to be stored in said ferroelectric capacitor.

14. The method of claim 13 wherein $Q_{max}$ is measured prior to each write operation being performed.

15. The method of claim 13 further comprising a read operation, said read operation comprising:
determining a second charge stored in said ferroelectric capacitor;
determining $Q_{max}$ for said ferroelectric capacitor;
converting said determined $Q_{max}$ and said second charge to a data value, said data value having more than two possible states.

16. The method of claim 15 wherein said ferroelectric capacitor comprises a parasitic linear capacitor and wherein determining $Q_{max}$ comprises measuring a third charge flowing from said ferroelectric capacitor when said ferroelectric capacitor is switched from a fully polarized state in one direction to a fully polarized state in an opposite direction, said third charge being corrected for a parasitic charge that was stored on said parasitic linear capacitor.

17. The method of claim 15 wherein $Q_{max}$ is determined when each read operation is performed.

18. The method of claim 13 wherein said ferroelectric capacitor is characterized by first and second conducting plates, said method further comprising:
providing a discharge path connecting said first and second conducting plates, said discharge path having an impedance that prevents a voltage between said first and second conducting plates being generated that is greater than a disturb voltage when said ferroelectric memory cell is not undergoing a read operation or a write operation, said disturb voltage being less than a voltage that would alter a charge stored in said ferroelectric capacitor by more than an amount that would alter a data value stored in said ferroelectric capacitor and said discharge path having an impedance being greater than an impedance that would cause an error in said read operation or said write operation when said ferroelectric capacitor is undergoing said read operation or said write operation.

19. A ferroelectric memory comprising a ferroelectric memory cell comprising a ferroelectric capacitor characterized by a maximum remanent charge, Qmax; and
a read circuit that determines a data value stored in said ferroelectric capacitor, said read circuit measuring a charge stored in said ferroelectric capacitor, measuring Qmax for said ferroelectric capacitor, and determining said data value from a ratio of said measured charge to said measured Qmax.

* * * * *